(12) United States Patent
Huang et al.

(10) Patent No.: US 7,148,515 B1
(45) Date of Patent: Dec. 12, 2006

(54) LIGHT EMITTING DEVICE HAVING INTEGRATED RECTIFIER CIRCUIT IN SUBSTRATE

(75) Inventors: Kuo-Jui Huang, Ping-Chen (TW); Wen-Long Chou, Ping-Chen (TW); Chia-Pin Sung, Hsinchu (TW)

(73) Assignee: Tyntek Corp., Hsinchu (TW)

( * ) Notice: Subject to any disclaimer, the term of this patent is extended or adjusted under 35 U.S.C. 154(b) by 0 days.

(21) Appl. No.: 11/326,706

(22) Filed: Jan. 7, 2006

(51) Int. Cl.
*H01L 27/15* (2006.01)

(52) U.S. Cl. ............................. 257/84; 257/82; 257/83

(58) Field of Classification Search ...................... None
See application file for complete search history.

(56) References Cited

U.S. PATENT DOCUMENTS 6,054,716 A * 4/2000 Sonobe et al. ............... 250/552
6,387,730 B1 * 5/2002 Guillot ........................ 438/107
6,472,688 B1   10/2002 Miyata ......................... 257/79

FOREIGN PATENT DOCUMENTS

JP             223889            5/1994

\* cited by examiner

*Primary Examiner*—Tuyet Thi Vo

(57) ABSTRACT

A LED-based light emitting device having integrated rectifier circuit driven directly by an AC voltage and a related fabrication method is provided herein. The light emitting mainly contains a lower substrate and an upper substrate. The lower substrate has a built-in rectifier circuit and appropriate electrical contacts of the rectifier circuit are exposed on the top surface of the lower substrate. The upper substrate contains multiple LEDs arranged in an N×M array and the LEDs are all electrically insulated from each other. Metallic plating techniques are applied to establish electrical connection between these LEDs so that they jointly form a circuit matching the rectifier circuit on the lower substrate. The two substrates are faced towards each other and metallic bumps are applied to connect the LED circuit on the upper substrate to the rectifier circuit on the lower substrate, completing a fully function light emitting device.

16 Claims, 16 Drawing Sheets

LIGHT EMITTING DEVICE HAVING INTEGRATED RECTIFIER CIRCUIT IN SUBSTRATE

BACKGROUND OF THE INVENTION

1. Field of the Invention

The present invention generally relates to light emitting devices using light emitting diodes, and more particularly to a light emitting device having a rectifier circuit integrated in the substrate and a related fabrication method thereof.

2. The Prior Arts

In general, an appropriate forward-biased DC voltage is applied to a light emitting diode (LED), and photons are thereby released as the electrons and holes of the LED are driven and re-combined with each other. Recently, as the applications of LEDs are extended to home and outdoor lighting applications, there are increasing demands for directly driving LEDs using AC voltages. However, if an AC voltage is applied on a LED, the LED would be damaged if an excessive reverse-biased voltage is exerted across the LED. A common solution is to adopt a transformer or a voltage reduction circuit or the like to reduce the level of the AC voltage so that the LED can withstand. The solution is effective but the price to pay is that a significant amount of electrical energy is converted to heat and wasted in the process.

Another problem associated with driving LEDs with an AC voltage is that the LEDs would be lit only during the half cycle that the LEDs are forward-biased. During the other half cycle, the LEDs are turned off as they are reversed-biased. As such, driving LEDs with an AC voltage is usually integrated with a rectifier circuit to turn the AC voltage into a DC voltage before it is applied on the LEDs. The most common rectifier circuit is the bridge rectifier circuit.

FIG. 1a is a schematic diagram showing a conventional approach in applying an AC voltage to a LED. As illustrated, the AC voltage from an AC power source (e.g., the 110V or 220V mains) 10 first passes through a voltage reduction device 20 (e.g., a resistor), and then rectified by the diodes 30 at the four arms of the bridge rectifier circuit, and then applied to the load 40 of the bridge rectifier circuit. FIGS. 1b and 1c are schematic diagrams showing the current path (in dashed lines) during the first half and second half of the AC voltage's each cycle. As illustrated, due to the function of the bridge rectifier circuit, the LED 40 (i.e., the load to the bridge rectifier circuit) is always forward-biased and lit during both half cycles.

Based on the same principle, as shown in FIG. 1d, a light emitting device disclosed by Republic of China, Taiwan Patent No. 265,741 arranges additional LEDs 40 in series connection along the four arms of the bridge rectifier circuit so that they will be lit at appropriate half cycles of the AC voltage as well.

In implementing the foregoing light emitting devices, conventionally, the appropriate circuit is first formed on a printing circuit board (PCB) or a substrate 50. Then, the diode dies 60 constituting the bridge rectifier circuit and the LED dies 70 are individually turned upside down so that their electrodes face downward towards the substrate 50, as illustrated in FIG. 1e. Finally, solder balls or metallic bumps 80 are used to connect the electrodes of the dies 60 and 70 to the appropriate location of the circuit on the substrate 60. Another conventional approach is to form the diodes of the bridge rectifier circuit and LEDs together on a substrate. Then, these diodes and LEDs are wire-bonded into the desired circuit using gold wires. The two approaches are all too complicated, contributing to rather lengthy production time and high production cost.

SUMMARY OF THE INVENTION

Accordingly, the present invention provides a novel light emitting device having an integrated rectifier circuit and a related fabrication method, which does not require the installation of individually reversed diodes and LEDs to the substrate, or the wire-bonding of the diodes and LEDs on the substrate.

The light emitting device according to the present invention mainly contains a lower substrate and an upper substrate. The lower substrate is usually made of silicon or other appropriate material, and has a built-in rectifier circuit formed using common integrated circuit manufacturing methods. The rectifier circuit could be a bridge rectifier circuit or other full-wave or half-wave rectifier circuit and appropriate electrical contacts of the rectifier circuit are exposed on the top surface of the lower substrate. The upper substrate contains multiple LEDs arranged in an N×M array using common integrated circuit manufacturing methods, and the LEDs are all electrically insulated from each other. Metallic plating techniques such as evaporation or sputtering are applied in advance to establish electrical connection between these LEDs so that they jointly form a circuit matching the rectifier circuit on the lower substrate.

At last, the two substrates are faced towards each other and metallic bumps are applied to connect the LED circuit on the upper substrate to the rectifier circuit on the lower substrate, completing a fully function light emitting device capable of accepting an AC voltage to turn the LEDs on. As such, the fabrication of the light emitting devices is significantly simplified, leading to a reduced production cost. The light emitting device according to the present invention also enjoys the following advantages: (1) the lower substrate also functions as a submount for the light emitting device when it is packaged and the heat produced by LEDs and the rectifier circuit could be dissipated from the lower substrate; (2) by having an appropriate number of LEDs on the upper substrate, the total operation voltage of the LEDs could be substantially equal to the input AC voltage and, therefore, the voltage reduction device could be omitted, leading to a further reduced production cost; and (3) the separation of the LED circuit and the rectifier circuit greatly simplifies the design of the light emitting device to meet various application requirements.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

FIG. 2b is a schematic sectional diagram showing the light emitting device of FIG. 2a.

FIG. 2e is a perspective diagram showing the attachment of the upper substrate to the lower substrate of the light emitting device of FIG. 2a.

FIG. 3b is a perspective diagram the attachment of the upper substrate to the lower substrate of the light emitting device of FIG. 3a.

FIG. 4b is a perspective diagram showing the upper substrate embodying the load circuit of FIG. 4a.

FIG. 5b is a perspective diagram showing the upper substrate of embodying the load circuit of FIG. 5a.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1A:
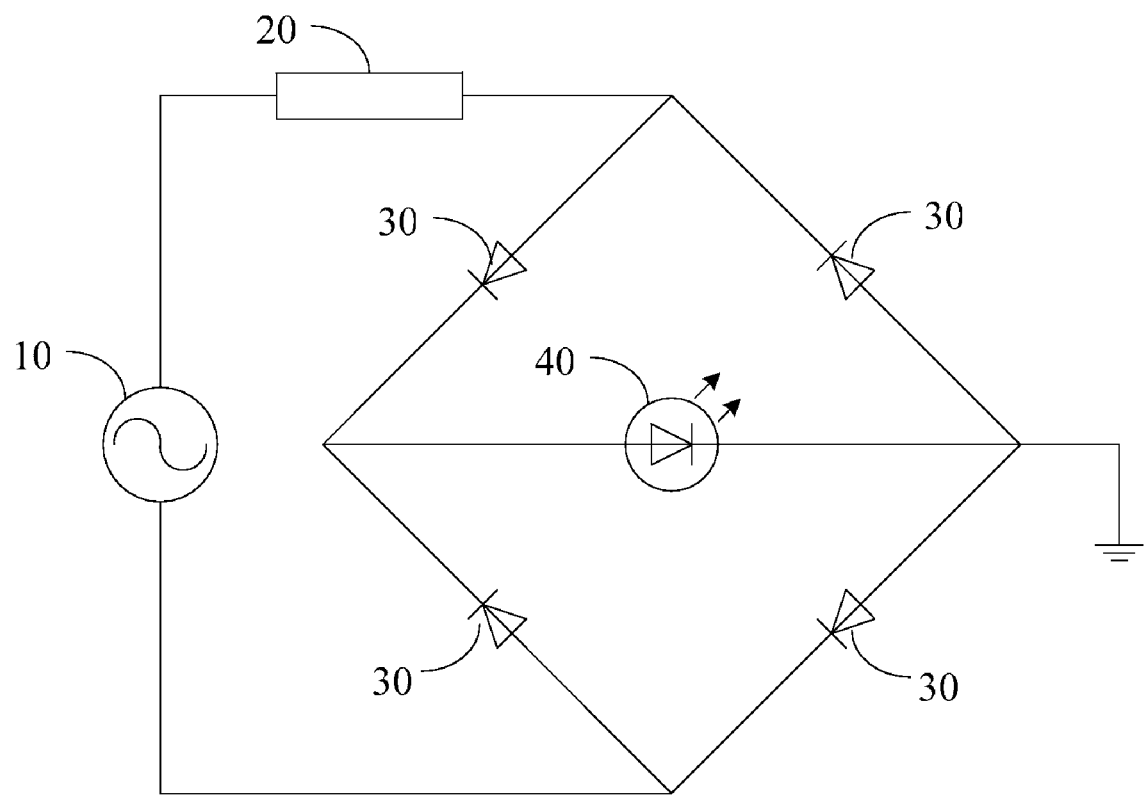
FIG. 1a is a schematic diagram showing a conventional approach in applying an AC voltage to a LED.
Figure 1B:
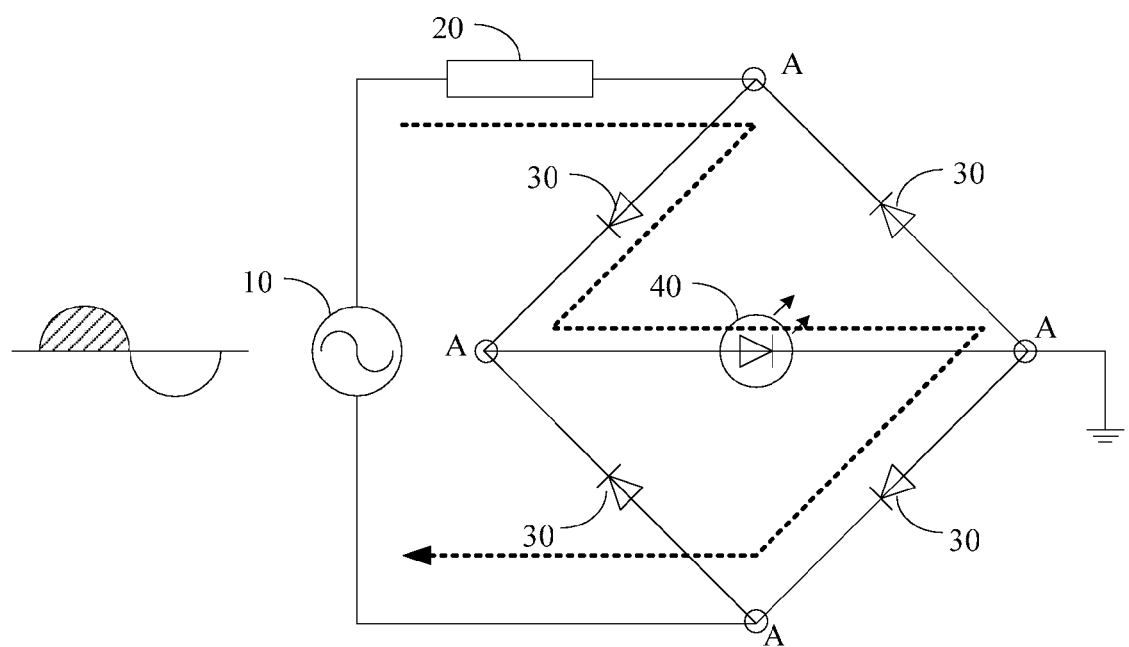
FIG. 1b is a schematic diagram showing the current path through the circuit of FIG. 1a during the first half cycle of an AV voltage.
Figure 1C:
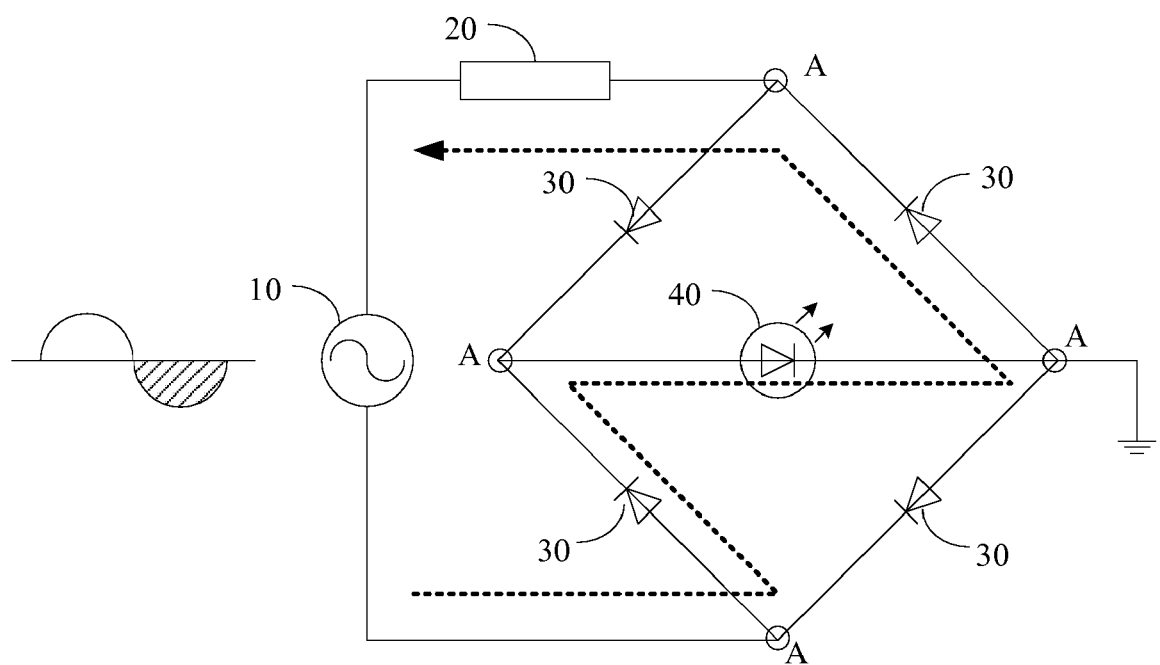
FIG. 1c is a schematic diagram showing the current path through the circuit of FIG. 1a during the second half cycle of an AV voltage.
Figure 1D:
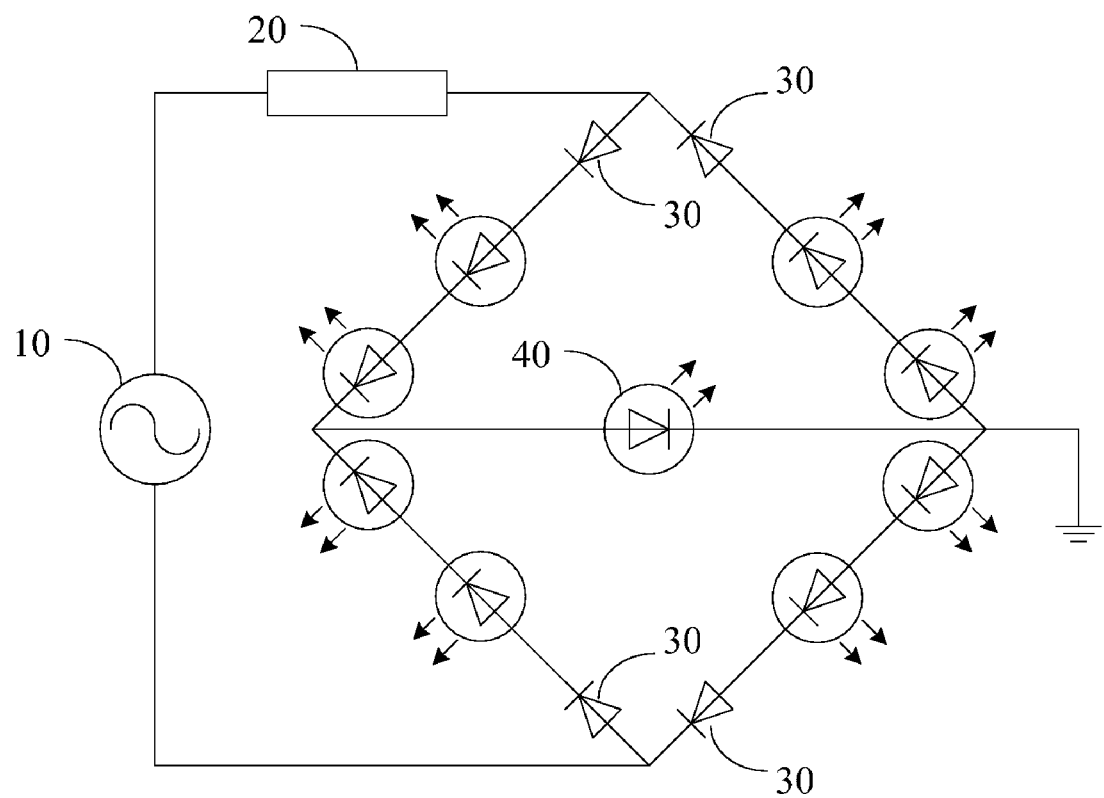
FIG. 1d is a schematic diagram showing a conventional light emitting device disclosed by Republic of China, Taiwan Patent No. 265,741.
Figure 1E:
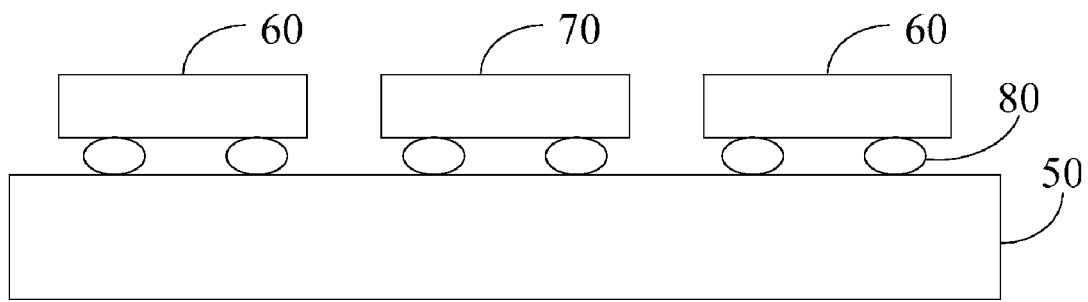
FIG. 1e is a schematic sectional diagram showing a conventional light emitting device.

A LED-based light emitting device having integrated rectifier circuit driven directly by an AC voltage and a related fabrication method are provided herein. Please note that the rectifier circuit being integrated could be a bridge rectifier circuit or other full-wave or half-wave rectifier circuit. In other words, the present invention does not require the rectifier circuit to be of a specific type. Please also note that the subject matter of the present invention is not the circuitry constituted by a rectifier circuit and a number of LEDs as shown in FIG. 1a. Many such circuit designs have already been disclosed in the prior arts. The major characteristics of the present invention lie in the integrated circuit (IC) structure implementing such circuitry.

The present invention also does not impose specific constraints on the components of the rectifier circuit, how the rectifier circuit functions, and the types and techniques of the LEDs. For example, the LEDs could be made of those semiconductor compounds composed of group III elements (such as Al, Ga, and In) and group V elements (such as N, P, and As). However, it has to be clarified that (1) the LEDs adopted by the present invention generally have their electrodes located on the same side of the LEDs so as to facilitate their electrical connection by evaporation or sputtering; and (2) the LEDs adopted by the present invention are turned upside down to join to the rectifier circuit and, as such, the LEDs are usually formed on a transparent substrate and there is usually a reflective layer located beneath the active layer of the LEDs when the LEDs are reversed so as to reflect the light of the LEDs upward. Even though the reflective layer and the transparent layer might affect the brightness and lighting efficiency of the resulted light emitting device, their configuration is not required by the present invention.

Figure 2A:
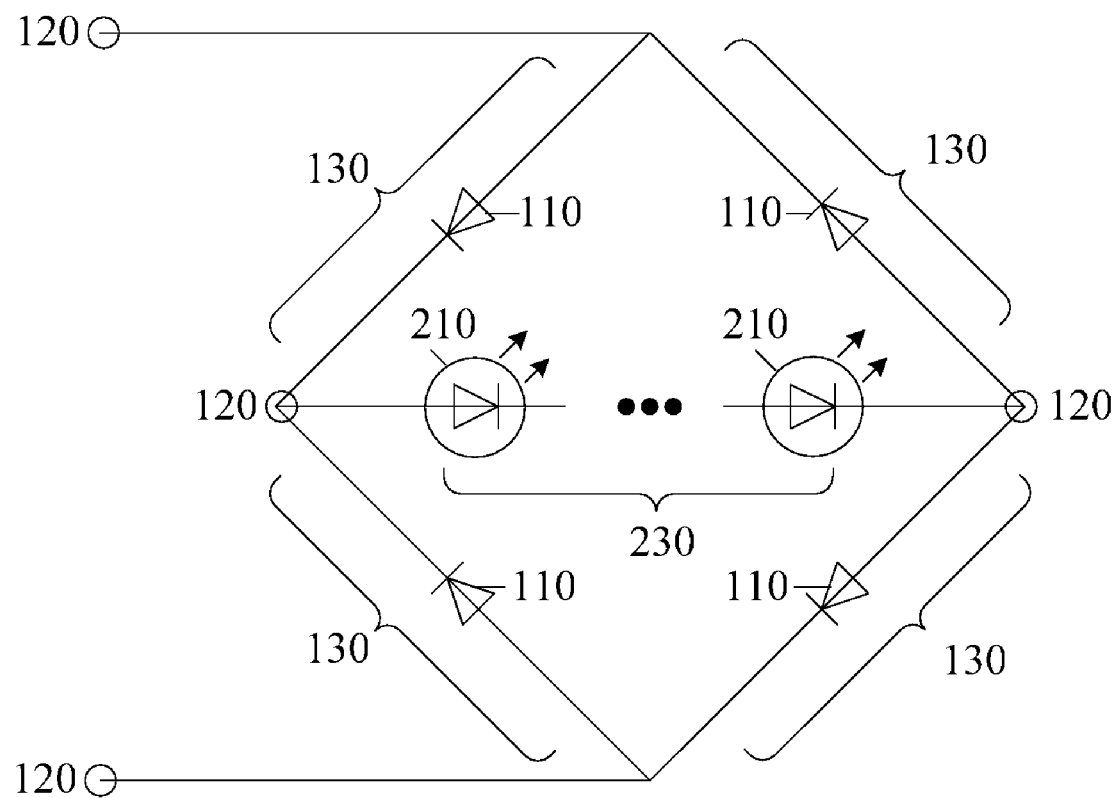
FIG. 2a is a schematic diagram showing the light emitting device according to an embodiment of the present invention.

FIG. 2a is a schematic diagram showing the light emitting device according to an embodiment of the present invention. As illustrated, the full circuit of the present invention includes the four circuit segments 130, each having a diode 110 and constituting the bridge rectifier circuit, and a load circuit 230 having a number of LEDs 210 in series and forward connection. Please note that, in alternative embodiments, the circuit segments 130 could contain multiple diodes 110 in an appropriate forward connection. These diodes 110 could be series-connected, parallel-connected, or in a combination of series and parallel connections. Similarly, in alternative embodiments, the LEDs 210 could also be parallel-connected, or in a combination of series and parallel connections.

Figure 2B:
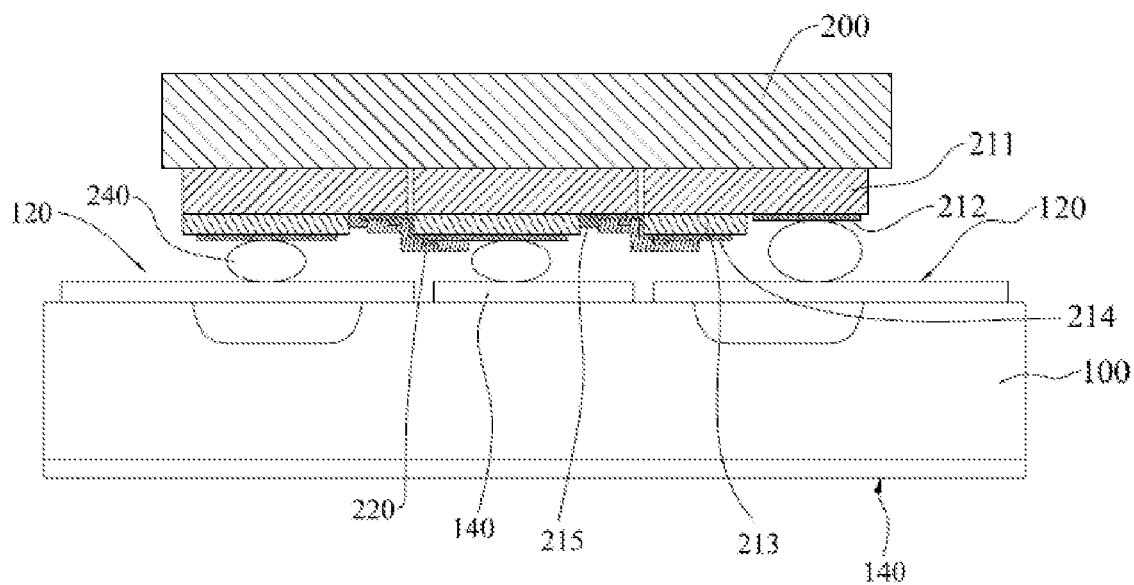

As shown in FIG. 2b, the present invention mainly contains a lower substrate 100 and an upper substrate 200. The lower substrate 100 is usually made of silicon or other appropriate material such as AlN or BeO. The circuit segments 130 including the diodes 110 of the foregoing bridge rectifier circuit are implemented on the lower substrate 100 in advance using common integrated circuit manufacturing methods. The epitaxial details of the diodes 110 are not illustrated in FIG. 2b, which at least contains appropriate p-type and n-type materials to form a p-n junction. The common integrated circuit manufacturing methods include, but are not limited to, any appropriate and conventional fabrication methods such as deposition, etching, ion implantation, etc. These details are quite well known to people skilled in the related arts and are omitted here.

Appropriate electrical contacts 120 are configured on the top surface of the lower substrate 100 for the connection to the load circuit 230 on the upper substrate 200. There are also electrical contacts (not shown) formed at appropriate location on the lower substrate for the connection to an external AC power source when the resulted light emitting device is put to use. Please note that the lower substrate 100 could also contains other relevant circuit components such as the resistors functioning as the voltage reduction device positioned between the AC power source and the input to the bridge rectifier circuit. In short, the major characteristic of the present invention is that the full circuit of the light emitting device is divided and implemented on the upper and lower substrates 200 and 100 respectively, and then the upper and lower substrates 200 and 100 are joined to complete the full circuit of the light emitting device. The lower substrate 100 also functions as a submount when the light emitting device is packaged, and the lower substrate 100 also provides heat dissipation for the bridge rectifier circuit and the LEDs. Therefore, a highly thermal conductive material could be coated on the top and bottom surfaces of the lower substrate 100, such as forming a metallic thin layer 140 by evaporation or sputtering, so as to enhance the heat dissipation efficiency. The electrical contacts 120 and the metallic thin layer 140 could be made of a metallic material such as Au, Al, Ti, Pt, Cr. Ni, W, Ag, Cu, etc., or a combination of the above.

As mentioned earlier, the upper substrate 200 mainly contains the load circuit having a number of LEDs 210. Therefore, depending on the light emitting technique adopted by the LEDs 210, the substrate 200 is made of a material appropriate for the epitaxial growth of the LEDs 210. For example, if the LEDs 210 are GaN-based LEDs, a typical substrate 200 is made of sapphire. The epitaxial structure for the LEDs 210 is usually formed by metal organic chemical vapor deposition (MOCVD) and, then, the LEDs 210 are configured in an N×M (N, M≧1) array and the LEDs 210 are electrically insulated from each other, using common integrated circuit manufacturing methods.

Figure 2C:
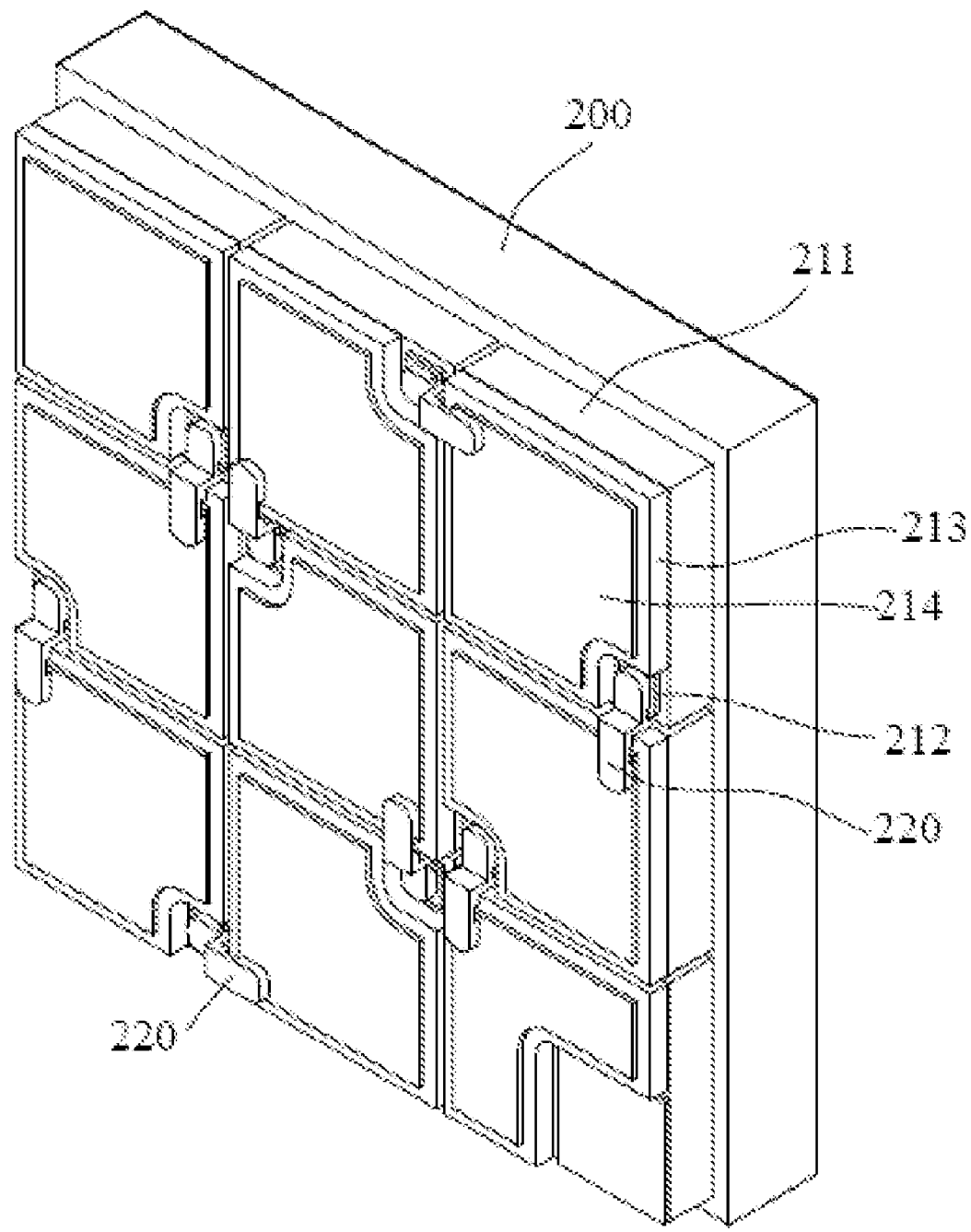
FIG. 2c is a perspective diagram showing the upper substrate of FIG. 2b.
Figure 2D:
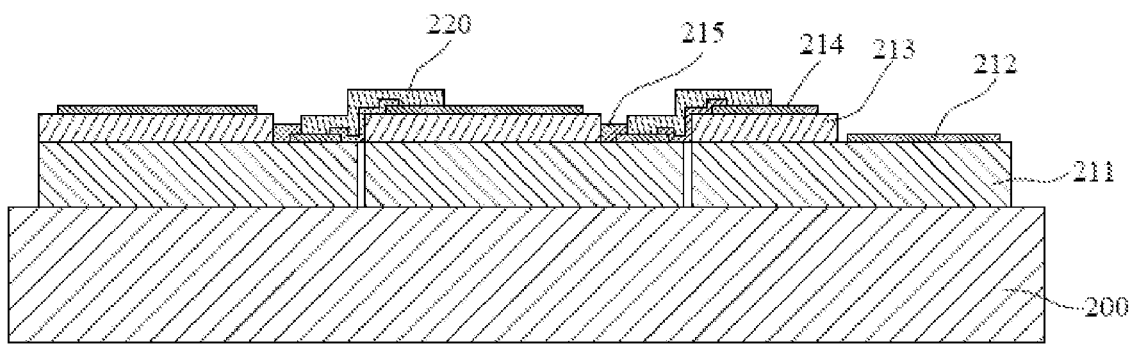
FIG. 2d is a schematic sectional diagram showing the upper substrate of FIG. 2b.

FIGS. 2c and 2d are perspective and sectional diagrams showing the upper substrate 200 respectively. As illustrated, each LED 210 contains an n-type semiconductor layer 211, an n-type electrode 212, a p-type semiconductor layer 213, and a p-type electrode 214, appropriately stacked together. Please note that this structure is exemplary only. The insulation of the LEDs 210 is achieved by an insulation layer 215 made of $SiO_x$, $SiN_x$, $Al_2O_3$, or TiN. The electrical connections 220 among the LEDs 210 are formed by metallic plating techniques such as evaporation or sputtering using a metallic material such as Au, Al, Ti, Pt, Cr, Ni, W, Ag, Cu, etc., or a combination of the above. As such, the LEDs 210 are series-connected, parallel-connected, or in a combination of series-connection and parallel connection, into the load circuit 230.

The upper substrate 200 is then turned upside down so that the LEDs 210 face downward towards the top surface of the lower substrate 100. Subsequently, metallic bumps 240 are used to connect the appropriate electrical contacts (not shown) of the load circuit segment 230 to the electrical contacts 120 of the lower substrate 100 by supersonic or thermal eutectic methods so that the full circuit of FIG. 2a for the light emitting device is completed. The metallic bumps 240 could be made of Au, AuSn, Sn, Al, or a combination of the above. In general, the electrical contacts on the lower and upper substrates 100 and 200 have to be configured correspondingly so that they can be connected together when the lower and upper substrates 100 and 200 are joined. After the circuit of FIG. 2a is completed, the light emitting device usually has to go through a packaging process so that the light emitting device can be installed on a circuit board of the lighting application. During this packaging process, the lower substrate 100 could be directly used as a submount.

In addition, the heat produced by the LEDs 210 and the bridge rectifier circuit could be dissipated form the lower substrate 100. On the other hand, using AlInGaN-based LEDs as example, their operation voltage is around 2~4 V with 20 mA operation current. Therefore, by having the array large enough to accommodate 25 LEDs series-connected together, the total operation voltage is around 100V and the light emitting device could accept the 110 V mains directly without using any voltage reduction device.

Figure 2E:
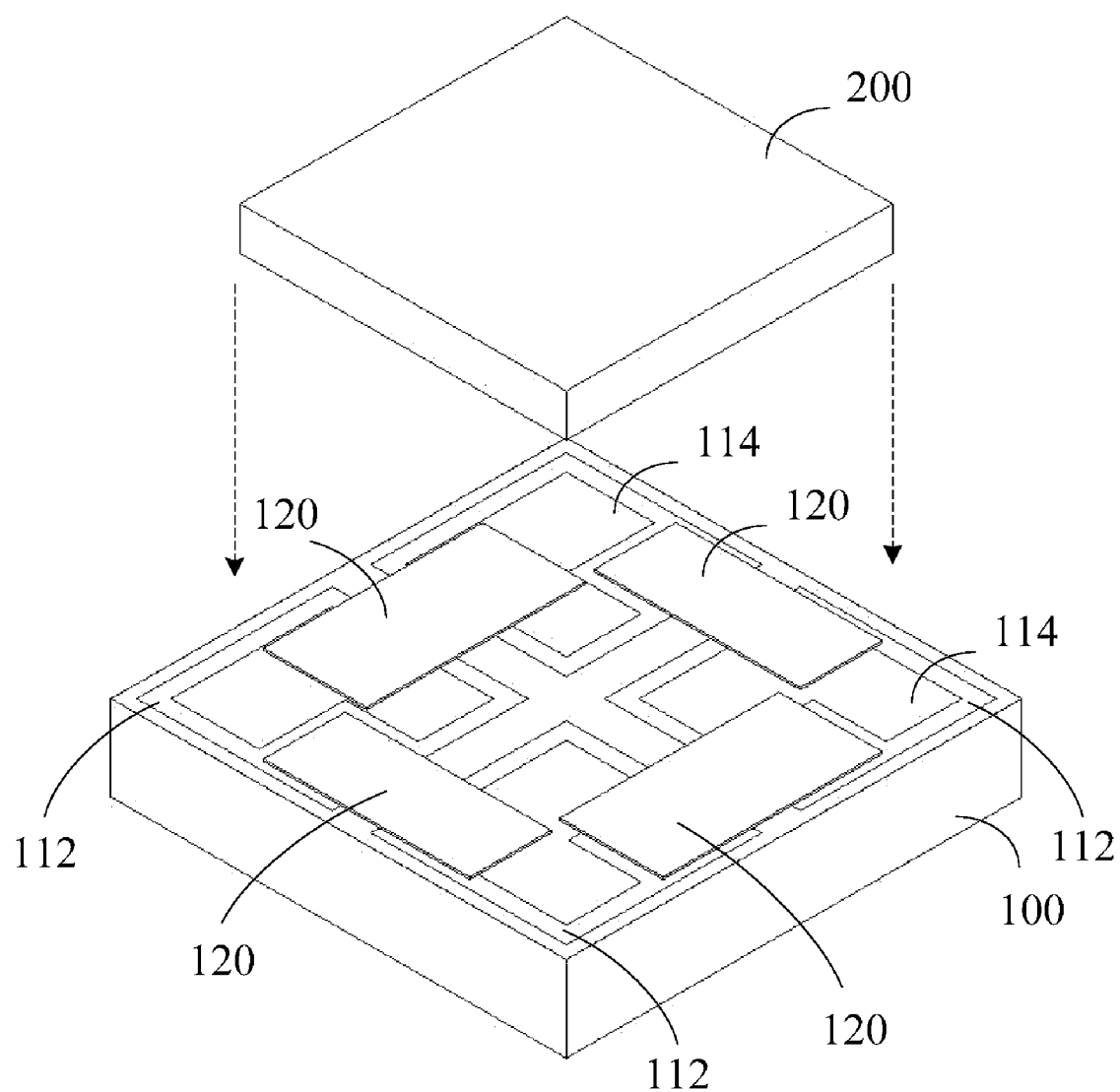

As mentioned earlier, the rectifier circuit formed on the lower substrate 100 could be a bridge rectifier or other full-wave or half-wave rectifier circuit. FIG. 2e is a perspective diagram showing the attachment of the upper substrate 100 embodying the bridge rectifier circuit (also a type of full-wave rectifier) to the lower substrate 200 of the light emitting device of FIG. 2a. As illustrated, the n-type areas 112 and p-type areas 114 of the diodes 110 (buried in the lower substrate 100) are appropriately joined to form the bridge (or full-wave) rectifier circuit by the electrical contacts 120. Please note that, for simplicity, the metallic thin layer 140 is not depicted in FIG. 2e. There are various other types of full-wave rectifier circuits whose implementations can be easily extended from the foregoing example.

Figure 3A:
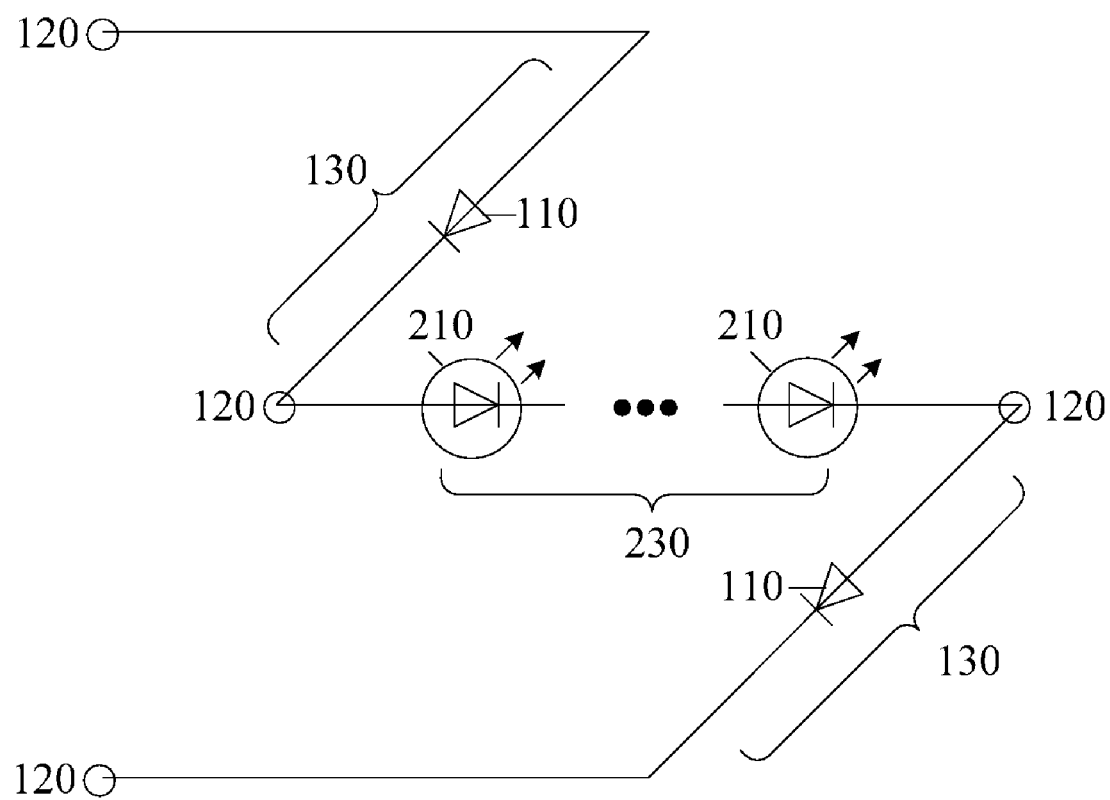
FIG. 3a is a schematic diagram showing the light emitting device according to another embodiment of the present invention.
Figure 3B:
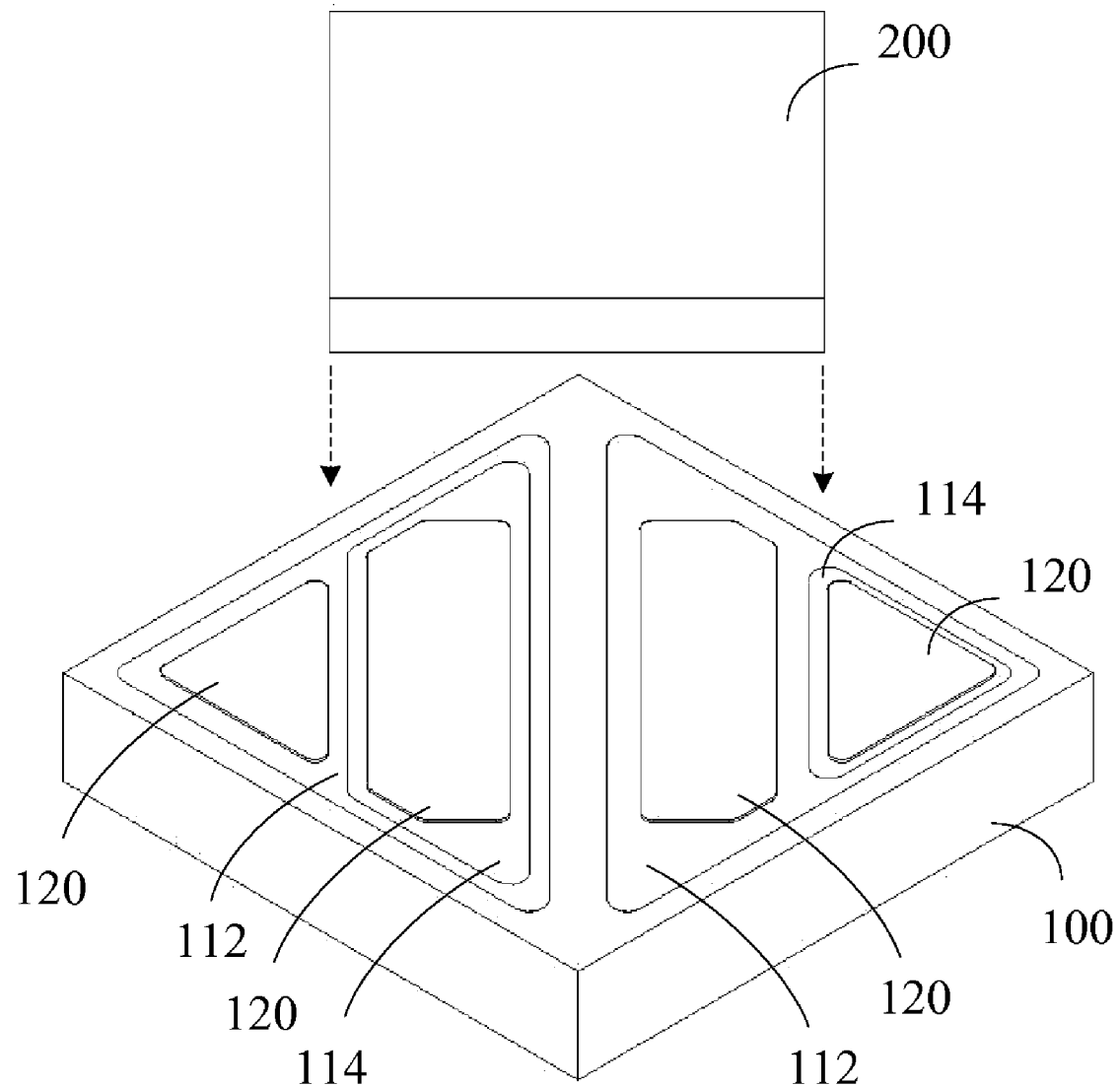

FIG. 3a is a schematic diagram showing the light emitting device according to another embodiment of the present invention where a half-wave rectifier circuit is implemented on the lower substrate 100. The attachment of the upper substrate 200 to the lower substrate 100 is illustrated in FIG. 3b.

Figure 4A:
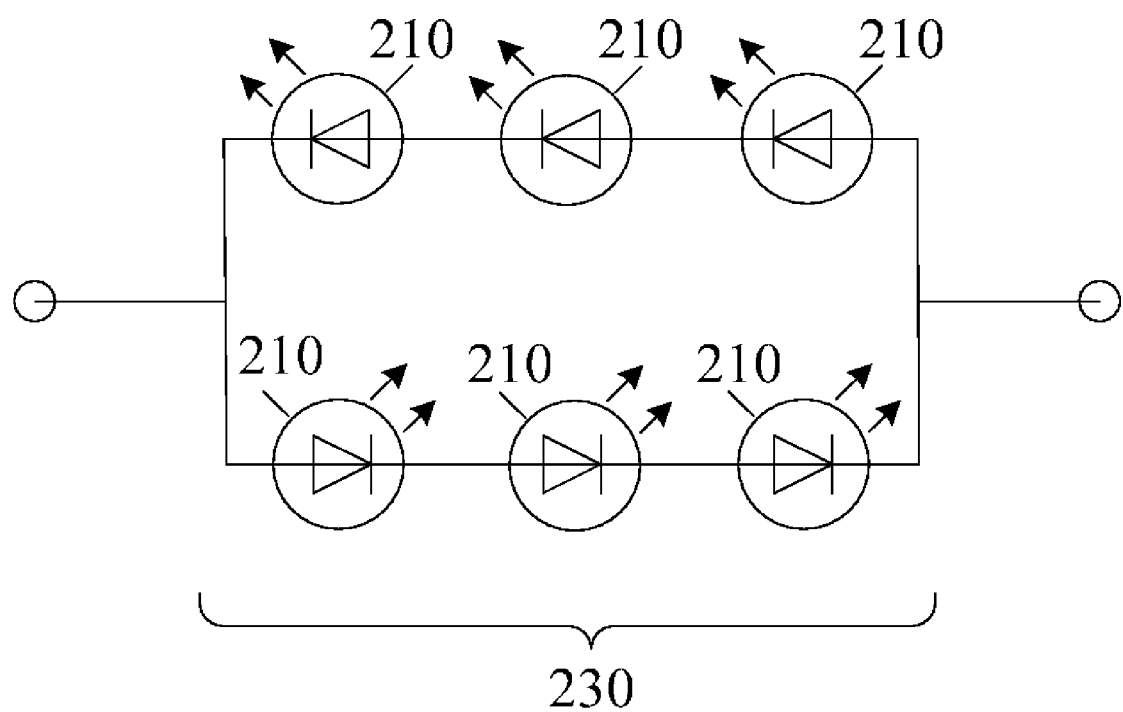
FIG. 4a is a schematic diagram showing the load circuit of the light emitting device according to another embodiment of the present invention.
Figure 4B:
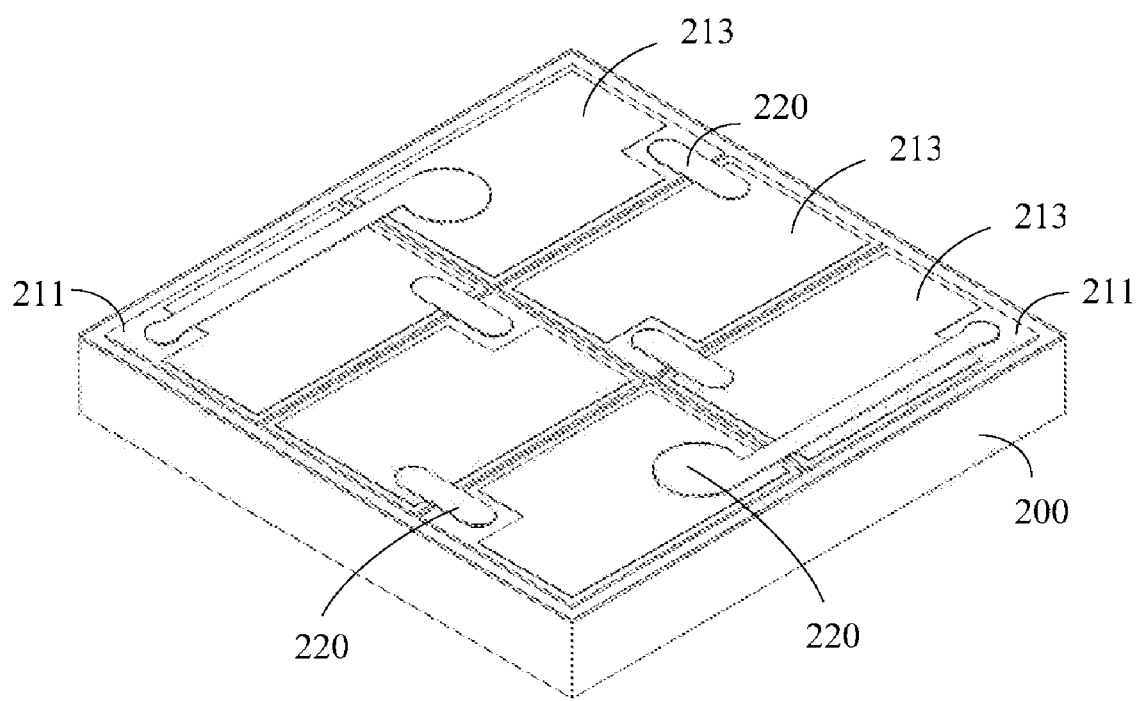
Figure 5A:
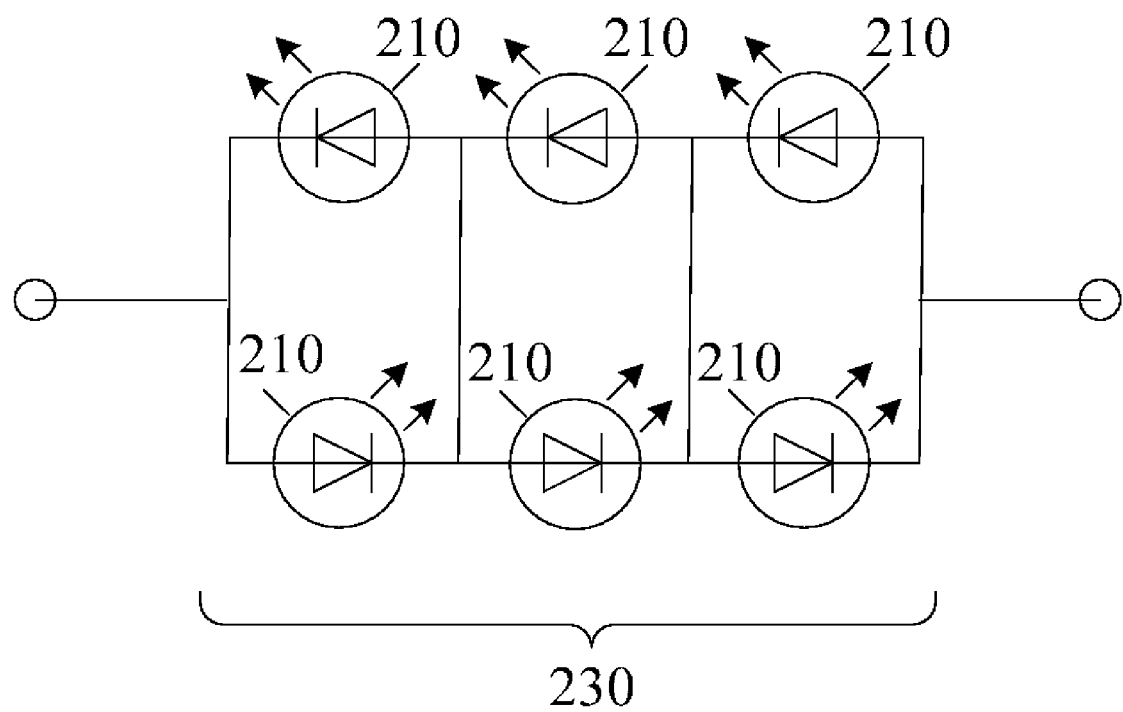
FIG. 5a is a schematic diagram showing the load circuit of the light emitting device according to yet another embodiment of the present invention.
Figure 5B:
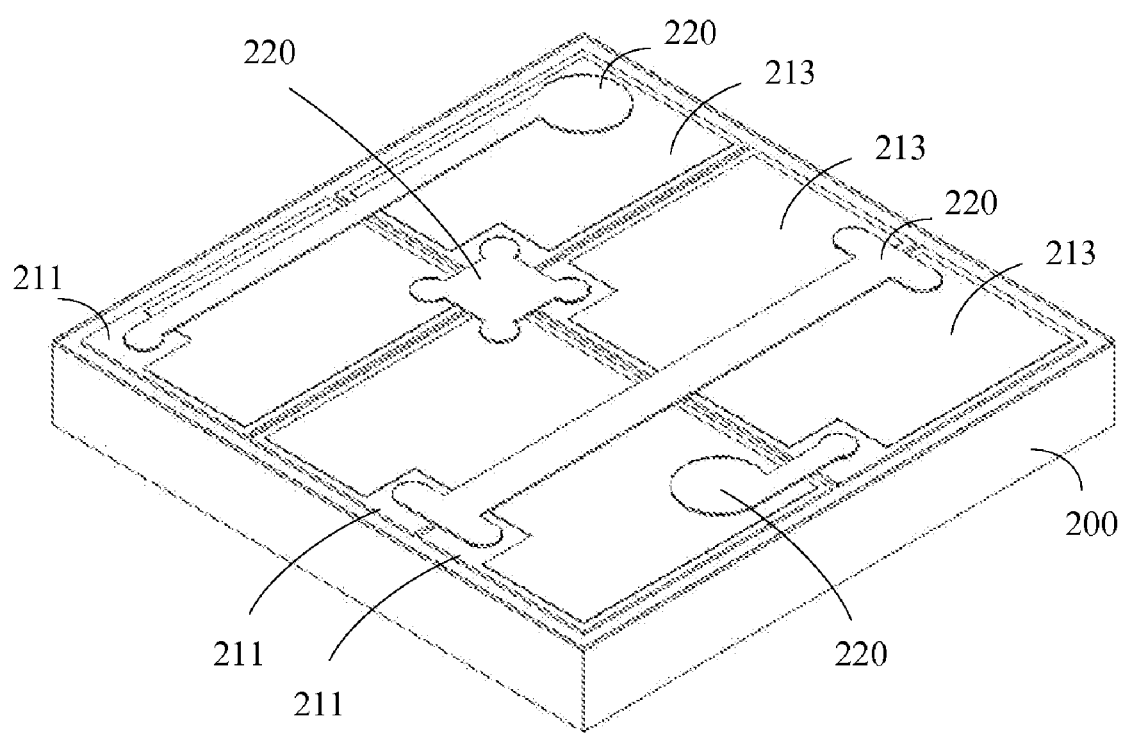

As mentioned earlier, the LEDs of the load circuit could also be parallel-connected, or in a combination of series and parallel connections. FIG. 4a shows two series of LEDs 210 in a parallel connection whose implementation in the upper substrate 200 is depicted in FIG. 4b. Similarly, FIG. 5a shows three groups of parallel-connected LEDs 210 in a series connection whose implementation in the upper substrate 200 is depicted in FIG. 5b. Please note that the load circuits 230 in FIGS. 4a and 5a are implemented for a particular type of rectifier circuit so that the two series of LEDs 210 of FIG. 4a or the LEDs 210 in each group of FIG. 5a are in reversed directions. Please also note that the electrodes 212 and 214 are covered by the electrical connections 220 and therefore are not visible.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A light emitting device integrating a rectifier circuit and a plurality of LEDs driven directly by an AC voltage, comprising:
   a lower substrate having said rectifier circuit, said rectifier circuit having a plurality of first electrical contacts configured on the top surface of said lower substrate; and
   an upper substrate having said LEDs mutually insulated and arranged in an N×M (N, M≧1) array, said LEDs being forward-connected in an appropriate topology by a plurality of electrical connections so as to form a load circuit matching to said rectifier circuit on said lower substrate, said load circuit having a plurality of second electrical contacts configured correspondingly to said first electrical contacts;
   wherein said array of said LEDs are faced downward towards the top surface of said lower substrate; and an appropriate electrical connection is established between corresponding pairs of said first electrical contacts and said second electrical contacts so as to complete the full circuit of said light emitting device.

2. The light emitting device according to claim 1, wherein said rectifying circuit is one of a bridge rectifying circuit, a full-wave rectifying circuit, and a half-wave rectifying circuit.

3. The light emitting device according to claim 1, wherein said appropriate topology of said LEDs is one of a series connection, a parallel connection, and a combination of series connections and parallel connections.

4. The light emitting device according to claim 1, wherein said lower substrate is a submount for said light emitting device in a subsequent packaging process.

5. The light emitting device according to claim 1, wherein said lower substrate further comprises a voltage reduction device located at an input end of said rectifier circuit.

6. The light emitting device according to claim 1, wherein said lower substrate further comprises a metallic thin layer configured on the bottom surface of said lower substrate.

7. The light emitting device according to claim 1, wherein said appropriate electrical connection between corresponding pairs of said first electrical contacts and said second electrical contacts is a metallic bump.

8. A fabrication method of a light emitting device integrating a rectifier circuit and a plurality of LEDs driven directly by an AC voltage, said fabrication method comprising the steps of:
(a) providing a lower substrate and an upper substrate wherein said rectifier circuit is formed in said lower substrate and a plurality of first electrical contacts of said rectifier circuit is configured on the top surface of said lower substrate using common integrated manufacturing methods, said LEDs are mutually insulated and arranged in an N×M (N, M≧1) array using common integrated circuit manufacturing methods, said LEDs are forward-connected in an appropriate topology by a plurality of electrical connections so as to form a load circuit, and said load circuit has a plurality of second electrical contacts configured correspondingly to said first electrical contacts; and
(b) joining each corresponding pairs of said first electrical contacts and said second electrical contacts by an appropriate electrical connection after facing said array of said LEDs downward towards the top surface of said lower substrate so as to complete the full circuit of said light emitting device.

9. The fabrication method to claim 8, wherein said rectifying circuit is one of a bridge rectifying circuit, a full-wave rectifying circuit, and a half-wave rectifying circuit.

10. The fabrication method according to claim 8, wherein said appropriate topology of said LEDs is one of a series connection, a parallel connection, and a combination of series connections and parallel connections.

11. The fabrication method according to claim 8, wherein said lower substrate is a submount for said light emitting device in a subsequent packaging process.

12. The fabrication method according to claim 8, wherein said step (a) further comprising:
forming a thin layer of highly thermal conductive material.

13. The fabrication method according to claim 8, wherein said appropriate electrical connection between corresponding pairs of said first electrical contacts and said second electrical contacts is a metallic bump.

14. The fabrication method according to claim 8, wherein said plurality of electrical connections between said LEDs are formed by one of the metallic evaporation method and the metallic sputtering method.

15. The fabrication method according to claim 13, wherein said first electrical contact and said second electrical contact are joined by said metallic bump by one of the supersonic method and the thermal eutectic method.

16. The fabrication method according to claim 12, wherein said thin layer of highly thermal conductive material is a metallic thin layer formed by one of the metallic evaporation method and the metallic sputtering method.

* * * * *